United States Patent
Charlebois et al.

(10) Patent No.: US 10,169,500 B2
(45) Date of Patent: Jan. 1, 2019

(54) CRITICAL PATH DELAY PREDICTION

(75) Inventors: Margaret R. Charlebois, Jericho, VT (US); Rashmi D. Chatty, Oviedo, FL (US); Christopher D. Hanudel, Essex Junction, VT (US); Robert D. Herzl, South Burlington, VT (US); David W. Milton, Underhill, VT (US); Clarence R. Ogilvie, Huntington, VT (US); Matthew P. Szafir, Williston, VT (US); Tad J. Wilder, South Hero, VT (US)

(73) Assignee: International Business Machines Corporation, Armonk, NY (US)

( * ) Notice: Subject to any disclaimer, the term of this patent is extended or adjusted under 35 U.S.C. 154(b) by 1970 days.

(21) Appl. No.: 13/204,812

(22) Filed: Aug. 8, 2011

(65) Prior Publication Data

US 2013/0041608 A1    Feb. 14, 2013

(51) Int. Cl.
*G06F 19/00*    (2018.01)
*G06F 17/50*    (2006.01)

(52) U.S. Cl.
CPC ................................ *G06F 17/5031* (2013.01)

(58) Field of Classification Search
CPC .................................................. G06F 17/5031
USPC ................................................................ 702/79
See application file for complete search history.

(56) References Cited

U.S. PATENT DOCUMENTS

| | | | |
|---|---|---|---|
| 6,111,427 A * | 8/2000 | Fujii et al. | ........................ 326/34 |
| 6,154,099 A | 11/2000 | Suzuki et al. | |
| 6,426,261 B1 * | 7/2002 | Fujii et al. | ..................... 438/276 |
| 7,024,568 B2 | 4/2006 | Maksimovic et al. | |
| 7,109,748 B1 * | 9/2006 | Liu et al. | ......................... 326/38 |
| 7,133,819 B1 * | 11/2006 | Hutton | ................. G06F 17/5031 703/19 |
| 7,164,998 B2 | 1/2007 | Cao | |
| 7,260,754 B2 | 8/2007 | Lee | |
| 7,301,378 B2 | 11/2007 | Cao | |
| 7,404,163 B2 * | 7/2008 | Chadwick et al. | ............ 716/113 |
| 7,417,482 B2 | 8/2008 | Elgebaly et al. | |
| 7,508,697 B1 * | 3/2009 | Mukhopadhyay et al. | .. 365/154 |
| 7,525,373 B1 * | 4/2009 | Ogilvie | ................. G06F 1/3296 327/564 |

(Continued)

FOREIGN PATENT DOCUMENTS

JP    2004228329 A    8/2004

OTHER PUBLICATIONS

Liu, "Multi-Voltage Adaptive Voltage Scaling SoC Reference Design," Nov. 2006, pp. 1-8, National Semiconductor Corporation Paper.

*Primary Examiner* — Yoshihisa Ishizuka
(74) *Attorney, Agent, or Firm* — Steven J. Meyers; Hoffman Warnick LLC

(57) ABSTRACT

Embodiments of the invention provide a method, system, and program product for predicting a delay of a critical path. In one embodiment, the invention provides a method of predicting a delay of at least one critical path of an integrated circuit, the method comprising: determining a delay of at least one ring oscillator on the integrated circuit; and calculating a predicted delay for the at least one critical path delay based on a delay of components of the critical path at a corner condition, a wire delay of the at least one critical path, a delay of the at least one ring oscillator at a corner condition, and the determined delay of the at least one ring oscillator.

17 Claims, 4 Drawing Sheets

(56) References Cited

U.S. PATENT DOCUMENTS

| | | | |
|---|---|---|---|
| 7,652,494 B2 | 1/2010 | Dobberpuhl et al. | |
| 7,679,458 B2 | 3/2010 | Malik | |
| 7,746,142 B2 | 6/2010 | Changchein et al. | |
| 8,015,526 B2 * | 9/2011 | Chadwick et al. | 716/108 |
| 2002/0104065 A1 * | 8/2002 | Tsukiyama et al. | 716/6 |
| 2003/0051220 A1 * | 3/2003 | Okada et al. | 716/12 |
| 2003/0054577 A1 * | 3/2003 | Yonezawa et al. | 438/14 |
| 2003/0101419 A1 * | 5/2003 | Yamashita et al. | 716/1 |
| 2005/0232053 A1 * | 10/2005 | Azuma et al. | 365/226 |
| 2006/0038622 A1 | 2/2006 | Choe et al. | |
| 2007/0096775 A1 * | 5/2007 | Elgebaly et al. | 327/105 |
| 2007/0136706 A1 * | 6/2007 | Hwang | G06F 17/5031 716/113 |
| 2008/0120065 A1 * | 5/2008 | Joshi | G01R 31/31727 702/182 |
| 2008/0250371 A1 * | 10/2008 | Uchino et al. | 716/6 |
| 2010/0085031 A1 * | 4/2010 | Dobberpuhl et al. | 323/318 |
| 2010/0180246 A1 | 7/2010 | Cheung et al. | |
| 2010/0293216 A1 * | 11/2010 | Kim et al. | 708/491 |
| 2010/0333057 A1 * | 12/2010 | Tang et al. | 716/126 |
| 2011/0156693 A1 * | 6/2011 | Dobberpuhl et al. | 324/76.39 |
| 2011/0187433 A1 * | 8/2011 | Baumann et al. | 327/276 |
| 2011/0239179 A1 * | 9/2011 | Shibatani et al. | 716/122 |
| 2012/0013408 A1 * | 1/2012 | Cortadella | G06F 17/505 331/34 |
| 2012/0075005 A1 * | 3/2012 | Flores et al. | 327/512 |
| 2012/0284680 A1 * | 11/2012 | Iyer et al. | 716/113 |

\* cited by examiner

CRITICAL PATH DELAY PREDICTION

TECHNICAL FIELD

The present invention relates generally to semiconductor chip and integrated circuit technologies and, more particularly, to the prediction of a critical path delay.

BACKGROUND OF THE INVENTION

The increased power demands of semiconductor chips are becoming more difficult to overcome, particularly as chip densities increase. Adaptive voltage scaling (AVS) is one technique used to reduce power consumption. Unfortunately, efficient use of AVS requires accurate predictions of critical path performance, and particularly critical path delay, something that has proven difficult to achieve.

SUMMARY OF THE INVENTION

Embodiments of the invention provide methods, systems, and program products for predicting a critical path delay.

A first aspect of the invention provides a method of predicting a delay of at least one critical path of an integrated circuit, the method comprising: determining a delay of at least one ring oscillator on the integrated circuit; and calculating a predicted delay for the at least one critical path delay based on a delay of components of the critical path at a corner condition, a wire delay of the at least one critical path, a delay of the at least one ring oscillator at a corner condition, and the determined delay of the at least one ring oscillator.

A second aspect of the invention provides a system comprising: at least one computing device configured for predicting a delay of at least one critical path of an integrated circuit by performing a method comprising: determining a delay through at least one ring oscillator on the integrated circuit; and calculating a predicted critical path delay based on a delay of components of the critical path at a corner condition, a wire delay of the at least one critical path, a delay of the at least one ring oscillator at a corner condition, and the determined delay of the at least one ring oscillator.

A third aspect of the invention provides a program product stored on a computer-readable storage medium which, when executed, is operable to predict a delay of at least one critical path of an integrated circuit by performing a method comprising: determining a delay through at least one ring oscillator on the integrated circuit; and calculating a predicted critical path delay for the at least one critical path delay based on a delay of components of the critical path at a corner condition, a wire delay of the at least one critical path, a delay of the at least one ring oscillator at a corner condition, and the determined delay of the at least one ring oscillator.

The illustrative aspects of the present invention are designed to solve the problems herein described and other problems not discussed, which are discoverable by a skilled artisan.

BRIEF DESCRIPTION OF THE DRAWINGS

These and other features of this invention will be more readily understood from the following detailed description of the various aspects of the invention taken in conjunction with the accompanying drawings that depict various embodiments of the invention, in which.

It is noted that the drawings of the invention are not to scale. The drawings are intended to depict only typical aspects of the invention, and therefore should not be considered as limiting the scope of the invention. In the drawings, like numbering represents like elements among the drawings.

DETAILED DESCRIPTION OF THE INVENTION

Figure 1:
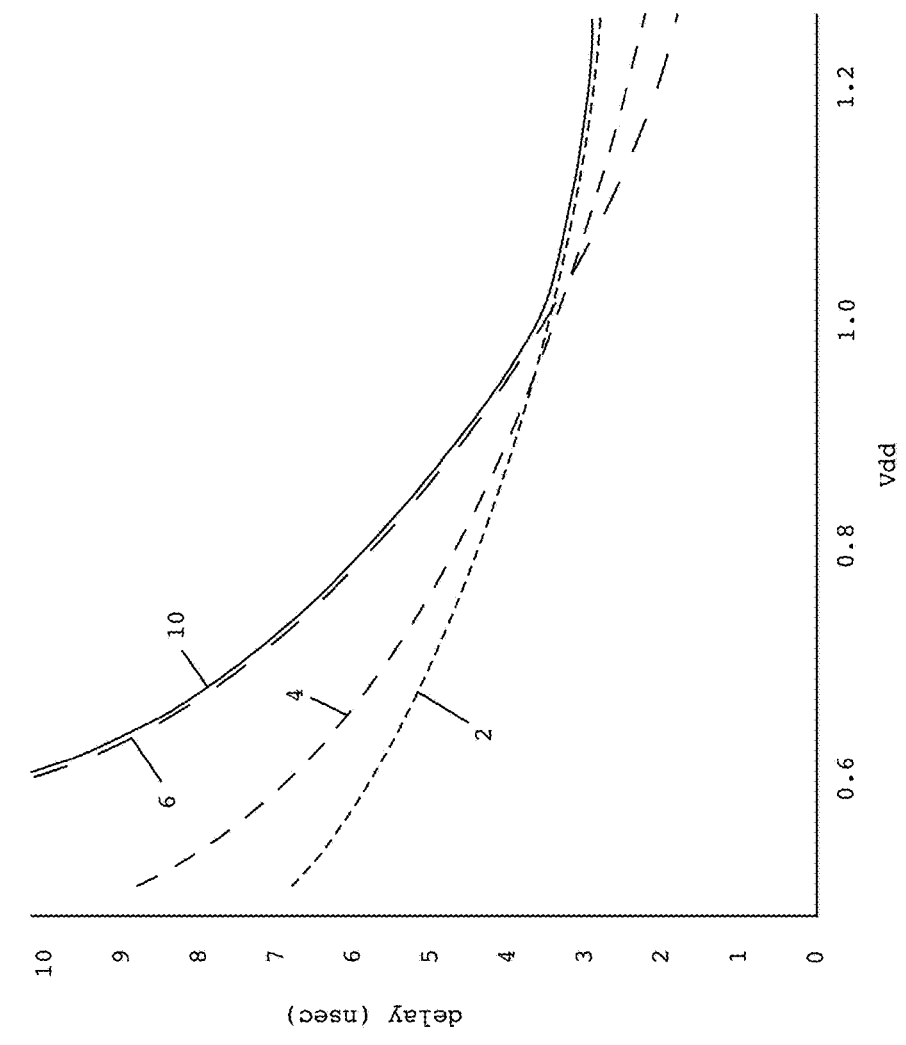
FIG. 1 shows a plot of the delays of critical path components as a function of drain voltage.

Turning now to the drawings, FIG. 1 shows an illustrative plot of the delay (in nanoseconds) associated with various critical path components as a function of drain voltage (Vdd). As can be seen in FIG. 1, at drain voltages less than about 1.0, high-voltage threshold (HVT) components 6 exhibit a greater delay than medium-voltage threshold (SVT) components 4 or low-voltage threshold (UVT) components 2. At drain voltages greater than about 1.0, however, UVT components 2 exhibit a greater delay than SVT components 4 or HVT components 6. One difficulty in predicting performance of a critical path, then, and particularly in predicting a delay of a critical path, is the differences in delays attributable to HVT, SVT, and UVT components as drain voltage changes. That is, any predicted delay of a critical path should remain below an upper bound 10 of the delays of all components in order to be useful in maximizing chip efficiency, particularly the efficiencies afforded by adaptive voltage scaling (AVS).

Figure 2:
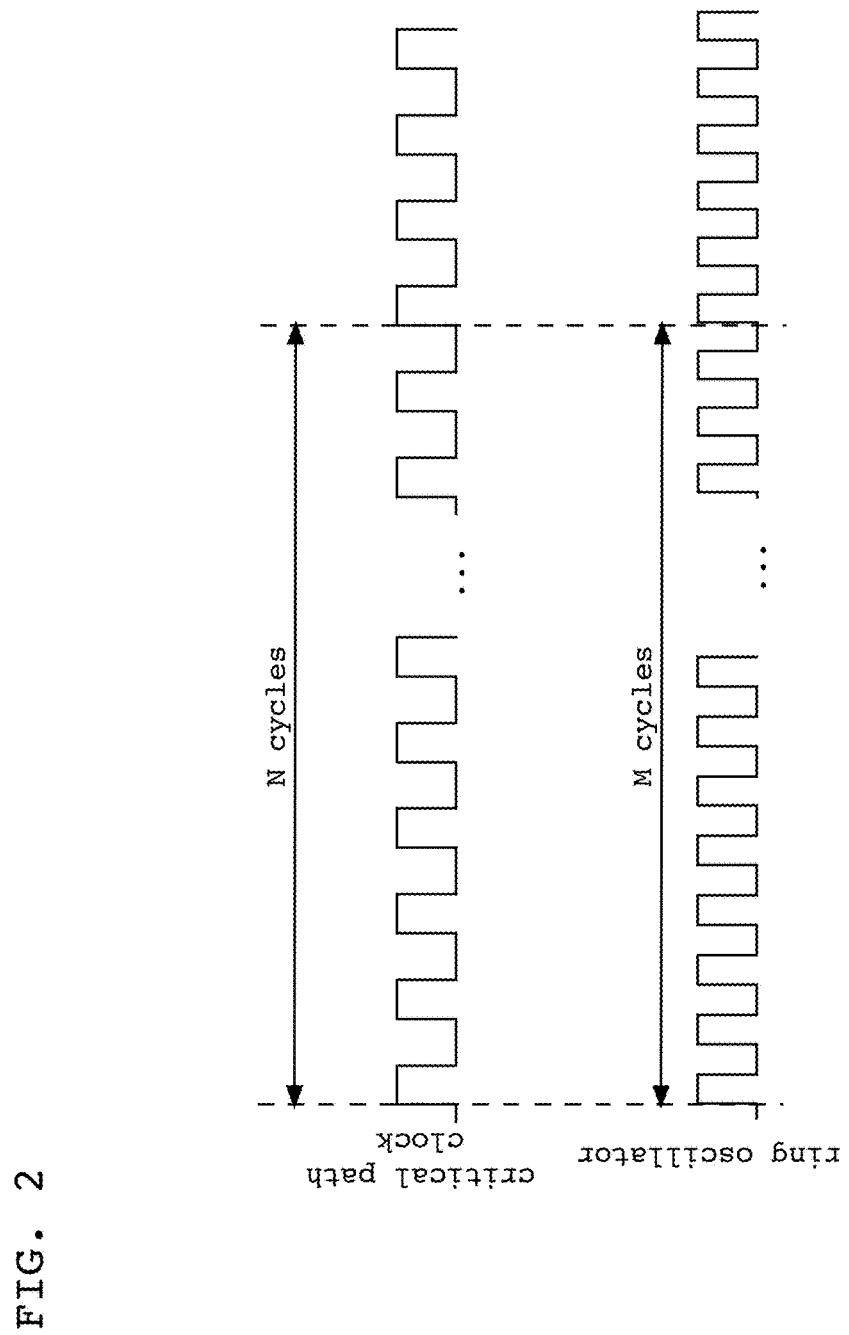
FIG. 2 shows a schematic of a critical path clock and ring oscillator frequency at a corner condition.

In one embodiment of the invention, performance of a critical path can be predicted, and chip efficiency improved, using static timing analysis data and real-time estimation of critical path performance using on-board ring oscillators. FIG. 2 shows a schematic of a critical path clock and ring oscillator frequency at a corner condition. As can be seen in FIG. 2, the N cycles of the critical path clock during the period shown correspond to M cycles of the ring oscillator. Using this correspondence, the ring oscillator frequency may be used to estimate a delay in the critical path, the components of which are sensitive to chip parameters, such as process, voltage, and temperature. In other words, once the critical path clock to ring oscillator frequency is known at a corner condition, the ring oscillator frequency under other conditions can be used to predict a critical path delay under those other conditions.

A predicted critical path delay can be calculated, in general, according to Equation 1 below.

$$D_{cp} = \left(\left[D_{C^{cc}} \times \left\{\frac{D_{RO}}{D_{RO^{cc}}}\right\}\right] + D_W\right) \quad \text{Equation 1}$$

In Equation 1, $D_{cp}$ is the predicted critical path delay, $D_C^{cc}$ is a delay of components of the at least one critical path at a corner condition, $D_{RO}$ is the determined delay of the at least one ring oscillator, $D_{RO}^{cc}$ is a nominal delay of the at least one ring oscillator at a corner condition, and $D_W$ is a delay through wiring of the at least one critical path at a corner condition. Other than the $D_{RO}$ value, which is determined in real-time, all other variables of Equation 1 may be derived from static timing analyses, such as an end point timing report.

Typically, the components of a critical path will be segregated according to their voltage thresholds or some other characteristic relevant to the delay attributable to a component. Equation 2 below shows such an embodiment, in which components of the critical path are grouped into HVT, SVT, and UVT components. Other groupings of critical path components are possible, of course, and are within the scope of the present invention.

$$D_{cp} = \left( \left[ D_{HVTC}^{cc} \times \left\{ \frac{D_{HVTRO}}{D_{HVTRO}^{cc}} \right\} \right] + \left[ D_{SVTC}^{cc} \times \left\{ \frac{D_{SVTRO}}{D_{SVTRO}^{cc}} \right\} \right] + \left[ D_{UVTC}^{cc} \times \left\{ \frac{D_{UVTRO}}{D_{UVTRO}^{cc}} \right\} \right] + D_W \right),$$

Equation 2

In Equation 2, $D_{cp}$ is the predicted critical path delay, $D_{HVTC}^{cc}$ is the delay of HVT components of the critical path at a corner condition, $D_{HVTRO}$ is the measured delay of HVT ring oscillators, $D_{HVTRO}^{cc}$ is the delay of the HVT ring oscillators at a corner condition, $D_{SVTC}^{cc}$ is the delay of SVT components of the critical path at a corner condition, $D_{SVTRO}$ is the measured delay of SVT ring oscillators, $D_{SVTRO}^{cc}$ is the delay of the SVT ring oscillators at a corner condition, $D_{UVTC}^{cc}$ is the delay of UVT components of the critical path at a corner condition, $D_{UVTRO}$ is the measured delay of UVT ring oscillators, $D_{UVTRO}^{cc}$ is the delay of the UVT ring oscillators at a corner condition, and DW is the wire delay of the critical path. Other than the calculated Dcp and the measured delays of the HVT, SVT, and UVT ring oscillators, all other values may be derived from static timing analysis. Thus, by monitoring on-board ring oscillator frequency, a critical path delay can be predicted in real-time without the need to monitor the critical path itself. In addition, because the predicted critical path delay is calculated in real-time, its value will change with changes in chip parameters, such as process, voltage, and temperature. This is particularly useful in improving chip performance and efficiency using AVS.

In addition to the wire delay shown in Equation 2, other variables not directly attributable to critical path components may be accounted for in the predicted critical path delays calculated according to the various embodiments of the invention. For example, it may be necessary or desirable to add a timing margin to account for known or expected inaccuracies in the measurements of delays, whether at a corner condition or during real-time monitoring of ring oscillator frequencies. In other cases, it may be necessary or desirable to add a technology margin account, for example, for known or expected differences between expected and actual voltages applied to a chip. Each of these variables is shown in Equation 3, below, wherein $\alpha$ is a timing margin and $\beta$ is a technology margin.

$$D_{cp} = \left( \left[ D_{HVTC}^{cc} \times \left\{ \frac{D_{HVTRO}}{D_{HVTRO}^{cc}} \right\} \right] + \left[ D_{SVTC}^{cc} \times \left\{ \frac{D_{SVTRO}}{D_{SVTRO}^{cc}} \right\} \right] + \left[ D_{UVTC}^{cc} \times \left\{ \frac{D_{UVTRO}}{D_{UVTRO}^{cc}} \right\} \right] + D_w + \alpha + \beta \right),$$

Equation 3

As will be understood by one skilled in the art, in most cases, a predicted delay will be desired for not one, but many critical paths on a chip. As a consequence, what is most appropriate for purposes of AVS will typically be the longest predicted critical path delay. For example, the critical path slack ($S_{cp}$) can be calculated using the longest predicted critical path delay according to Equation 4 below, in which $F_{sys}$ is the system frequency.

$$S_{cp} = \left( \frac{1}{F_{sys}} \right) - \text{longest } D_{cp}$$

Equation 4

In addition, the critical path slack ($S_{cp}$) can be multiplied by the maximum delay to voltage coefficient (DVC) for the technology to yield the control feedback voltage adjust (CFV), as in Equation 5 below.

$$CFV = S_{cp} \times DVC$$

Equation 5

Figure 3:
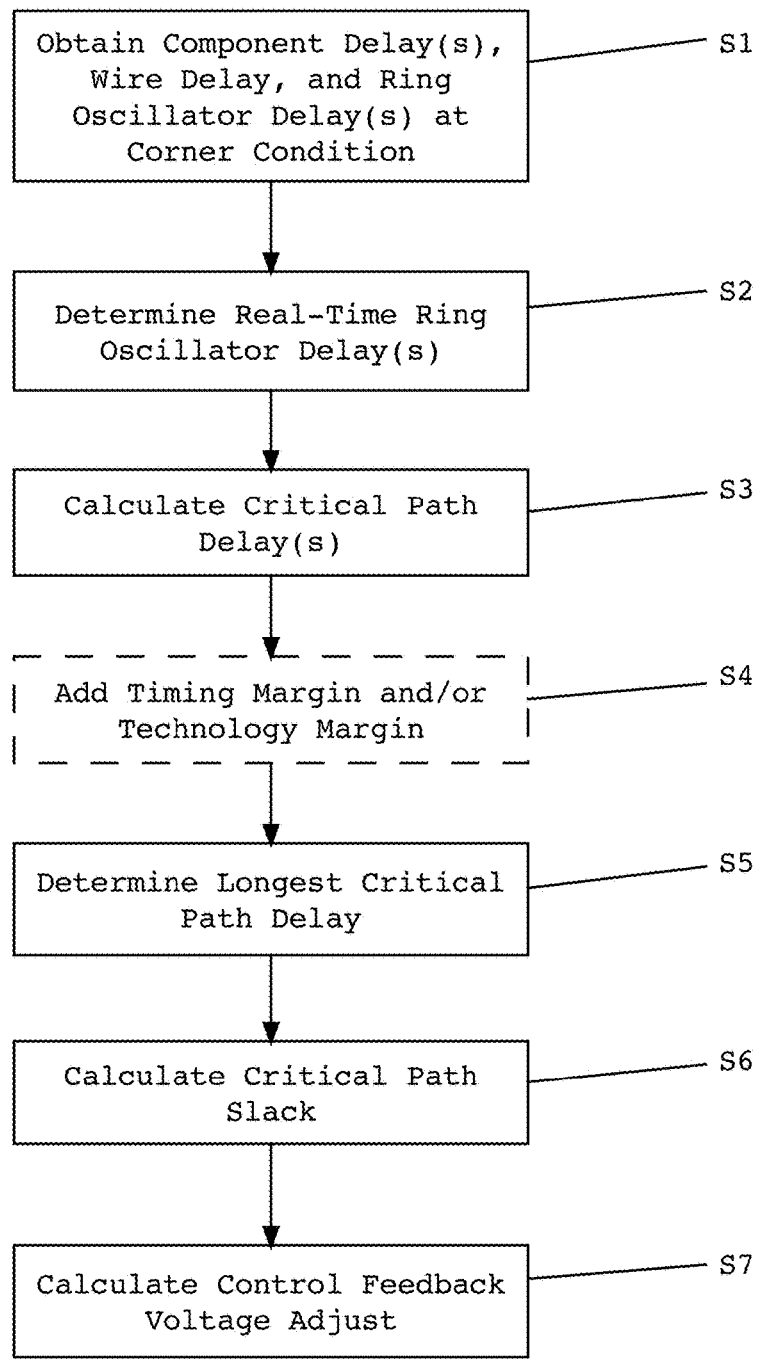
FIG. 3 shows a flow diagram of a method according to one embodiment of the invention.

FIG. 3 shows a flow diagram of a method according to an embodiment of the invention. At S1, component delay(s), wire delay, and ring oscillator delay(s) at a corner condition are obtained from static timing analyses. As noted above, these values can be obtained, for example, from an end point timing report.

At S2, on-board ring oscillator delay(s) is/are determined in real-time. As noted above, this real-time determination accounts for chip parameters affecting critical path delay, such as process, voltage, and temperature. Using the values obtained at S1 and the delay(s) determined at S2, a predicted critical path delay can be calculated at S3.

While S1 thorough S3 are shown relative to a single critical path, as noted above, predicted critical path delays will typically be calculated for a plurality of critical paths using ring oscillator delays determined simultaneously or substantially simultaneously at S2. The critical path delay(s) calculated at S3 may be calculated, for example, according to Equation 2 above. At S4, a timing margin and/or technology margin may optionally be added to the critical path delay(s) calculated at S3. For example, a timing margin and technology margin may be included in the calculated critical path delay(s) using Equation 3 above.

Additional steps may be taken where the calculated critical path delay(s) will be used in AVS. At S5, the longest critical path calculated at S3 (and/or S4) is determined. At S6 and S7, a critical path slack and control feedback voltage adjust, respectively, may be calculated, as described above.

Figure 4:
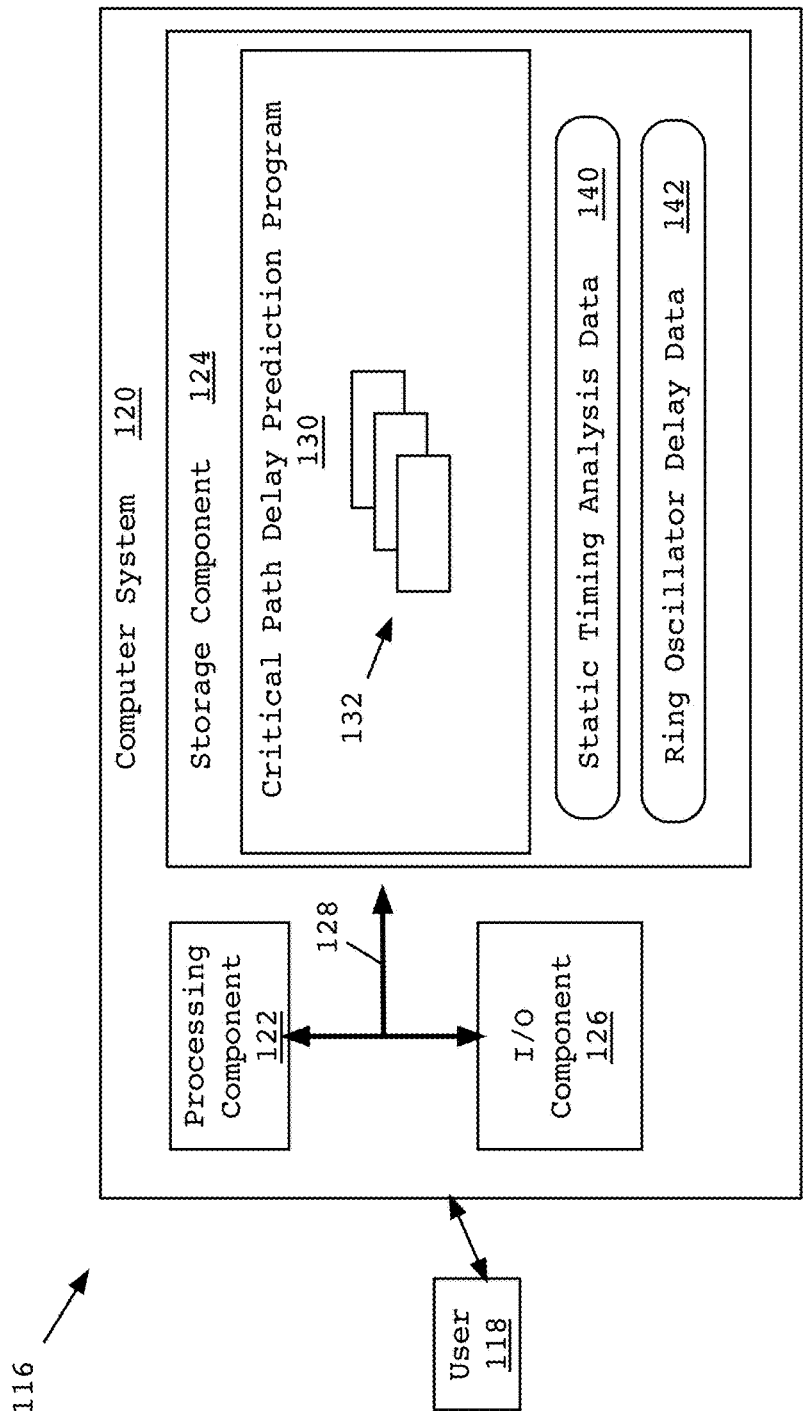
FIG. 4 shows a schematic of an illustrative system according to an embodiment of the invention.

FIG. 4 shows an illustrative environment 116 for predicting a critical path delay according to an embodiment of the invention. Environment 116 includes a computer system 120 that can perform a process described herein in order to predict a critical path delay. In particular, computer system 120 is shown including a critical path delay prediction program 130, which makes computer system 120 operable to predict a critical path delay by performing a process described herein.

Computer system 120 is shown including a processing component 122 (e.g., one or more processors), a storage component 124 (e.g., a storage hierarchy), an input/output (I/O) component 126 (e.g., one or more I/O interfaces and/or devices), and a communications pathway 128. In general, processing component 122 executes program code, such as critical path delay prediction program 130, which is at least partially fixed in storage component 124. While executing program code, processing component 122 can process data, which can result in reading and/or writing transformed data from/to storage component 124 and/or I/O component 126 for further processing. Communications pathway 128 provides a communications link between each of the components in computer system 120. I/O component 126 can comprise one or more human I/O devices, which enable a human user 118 to interact with computer system 120 and/or one or more communications devices to enable a system user 118 to communicate with computer system 120 using any type of communications link. To this extent, critical path delay prediction program 130 can manage a set of interfaces (e.g., graphical user interface(s), application program interface, and/or the like) that enable human and/or system users 118 to interact with critical path delay prediction program 130. Further, critical path delay prediction program 130 can manage (e.g., store, retrieve, create, manipulate, organize, present, etc.) the data, such as static timing analysis data 140 and/or ring oscillator delay data 142 using any solution.

In any event, computer system 120 can comprise one or more general purpose computing articles of manufacture (e.g., computing devices) capable of executing program code, such as critical path delay prediciction program 130, installed thereon. As used herein, it is understood that "program code" means any collection of instructions, in any language, code or notation, that cause a computing device having an information processing capability to perform a particular action either directly or after any combination of the following: (a) conversion to another language, code or notation; (b) reproduction in a different material form; and/or (c) decompression. To this extent, critical path delay prediction program 130 can be embodied as any combination of system software and/or application software.

Further, critical path delay prediction program 130 can be implemented using a set of modules 132. In this case, a module 132 can enable computer system 120 to perform a set of tasks used by critical path delay prediction program 130, and can be separately developed and/or implemented apart from other portions of critical path delay prediction program 130. As used herein, the term "component" means any configuration of hardware, with or without software, which implements the actions described in conjunction therewith using any solution, while the term "module" means program code that enables a computer system 120, such as a general purpose computing device, to implement the actions described in conjunction therewith using any solution. When fixed in a storage component 124 of a computer system 120 that includes a processing component 122, a module is a substantial portion of a component that implements the actions. Regardless, it is understood that two or more components, modules, and/or systems may share some/all of their respective hardware and/or software. Further, it is understood that some of the functionality discussed herein may not be implemented or additional functionality may be included as part of computer system 120.

When computer system 120 comprises multiple computing devices, each computing device can have only a portion of critical path delay prediction program 130 fixed thereon (e.g., one or more modules 132). However, it is understood that computer system 120 and critical path delay prediction program 130 are only representative of various possible equivalent computer systems that may perform a process described herein. To this extent, in other embodiments, the functionality provided by computer system 120 and critical path delay prediction program 130 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 120 includes multiple computing devices, the computing devices can communicate over any type of communications link. Further, while performing a process described herein, computer system 120 can communicate with one or more other computer systems, such as a system user 118, using any type of communications link. In either case, the communications link can comprise any combination of various types of wired and/or wireless links; comprise any combination of one or more types of networks; and/or utilize any combination of various types of transmission techniques and protocols.

As discussed herein, critical path delay prediction program 130 enables computer system 120 to predict a delay of a critical path. To this extent, critical path delay prediction program 130 is configured to enable computer system 120 to manage static timing analysis data 140 and ring oscillator delay data 142, which computer system 120 can process to predict a critical path delay. In an embodiment of the invention, static timing analysis data 140 comprises a set of data representing the results of a static timing analysis of a critical path for which a delay will be predicted.

In another embodiment, the invention provides a method that performs the process steps of the invention on a subscription, advertising, and/or fee basis. That is, a service provider could offer to predict a delay of a critical path, as described above. In this case, the service provider can create, maintain, support, etc., a computer infrastructure, such as computer system 120, that performs the process steps of the invention for one or more customers. In return, the service provider can receive payment from the customer(s) under a subscription and/or fee agreement and/or the service provider can receive payment from the sale of advertising space to one or more third parties.

In still another embodiment, the invention provides a method of generating a system for predicting a delay of a critical path. In this case, a computer infrastructure, such as computer system 120, can be obtained (e.g., created, maintained, having made available to, etc.) and one or more systems for performing the process steps of the invention can be obtained (e.g., created, purchased, used, modified, etc.) and deployed to the computer infrastructure. To this extent, the deployment of each system can comprise one or more of (1) installing program code on a computer system, such as computer system 120, from a computer-readable medium; (2) adding one or more computer systems to the computer infrastructure; and (3) incorporating and/or modifying one or more existing systems of the computer infrastructure, to enable the computer infrastructure to perform the process steps of the invention.

The terminology used herein is for the purpose of describing particular embodiments only and is not intended to be limiting of the disclosure. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of predicting a delay of one or more critical paths of an integrated circuit, the method comprising:
    determining a respective delay of each of a plurality of on-board ring oscillators on the integrated circuit based on a real-time measurement of a respective frequency of each of the plurality of ring oscillators,
    wherein the plurality of on-board ring oscillators includes one or more on-board high-voltage threshold (HVT) ring oscillators, one or more on-board medium-voltage threshold (SVT) ring oscillators, and one or more on-board low-voltage threshold (UVT) ring oscillators; and
    calculating, using a computer system processor, a predicted delay for each of the one or more critical paths based on a delay of components of the respective critical path at a corner condition, a wire delay of the respective critical path, a delay of each of the plurality of on-board ring oscillators at a corner condition, and the determined delay of each of the plurality of on-board ring oscillators,
    wherein each of the one or more critical paths include at least one HVT component on the integrated circuit having a first voltage threshold, at least one SVT component on the integrated circuit having a second voltage threshold less than the first voltage threshold, and at least one UVT component on the integrated circuit having a third voltage threshold less than both the first voltage threshold and the second voltage threshold.

2. The method of claim 1,
    wherein calculating the predicted delay of each of the one or more critical paths includes calculating the predicted delay of each of the one or more critical paths according to the equation:

$$D_{cp} = \left(\left[D_{HVTC}^{cc} \times \left\{\frac{D_{HVTRO}}{D_{HVTRO^{cc}}}\right\}\right] + \left[D_{SVTC}^{cc} \times \left\{\frac{D_{SVTRO}}{D_{SVTRO^{cc}}}\right\}\right] + \left[D_{UVTC}^{cc} \times \left\{\frac{D_{UVTRO}}{D_{UVTRO^{cc}}}\right\}\right] + D_W\right),$$

wherein $D_{cp}$ is the predicted delay of the respective critical path, $D_{HVTC}^{cc}$ is the delay of HVT components of the respective critical path at a corner condition, $D_{HVTRO}$ is the determined delay of the HVT ring oscillators, $D_{HVTR}^{cc}$ is the delay of the HVT ring oscillators at a corner condition, $D_{SVTC}^{cc}$ is the delay of SVT components of the respective critical path at a corner condition, $D_{SVTRO}$ is the determined delay of the SVT ring oscillators, $D_{SVTRO}^{cc}$ is the delay of the SVT ring oscillators at a corner condition, $D_{UVTC}^{cc}$ is the delay of UVT components of the respective critical path at a corner condition, $D_{UVTRO}$ is the determined delay of the UVT ring oscillators, $D_{UVTRO}^{cc}$ is the delay of the UVT ring oscillators at a corner condition, and $D_W$ is the wire delay of the respective critical path.

3. The method of claim 1, further comprising:
    adding to the predicted delay of each of the one or more critical paths at least one of the following: a timing margin or a technology margin.

4. The method of claim 1, wherein the one or more critical paths includes a plurality of critical paths and the method further comprises determining a longest predicted critical path delay from among the plurality of predicted delays calculated for the plurality of critical paths.

5. The method of claim 4, further comprising:
    calculating a critical path slack according to the equation:

$$S_{cp} = \left(\frac{1}{F_{sys}}\right) - \text{longest } D_{cp},$$

wherein $S_{cp}$ is the critical path slack, $F_{sys}$ is a system frequency, and longest $D_{cp}$ is the longest predicted critical path delay.

6. A system comprising:
    at least one computing device configured for predicting a delay of one or more critical paths of an integrated circuit by performing a method comprising:
    determining a respective delay of each of a plurality of on-board ring oscillators on the integrated circuit based on a real-time measurement of a respective frequency of each of the at least one plurality of ring oscillators,
    wherein the plurality of on-board ring oscillators includes one or more on-board high-voltage threshold (HVT) ring oscillators, one or more on-board medium-voltage threshold (SVT) ring oscillators, and one or more on-board low-voltage threshold (UVT) ring oscillators; and
    calculating a predicted delay for each of the one or more critical paths based on a delay of components of the respective critical path at a corner condition, a wire delay of the respective critical path, a delay of each of the plurality of on-board ring oscillators at a corner condition, and the determined delay of each of the plurality of on-board ring oscillators,
    wherein each of the one or more critical paths include at least one HVT component on the integrated circuit having a first voltage threshold, at least one SVT component on the integrated circuit having a second voltage threshold less than the first voltage threshold, and at least one UVT component on the integrated circuit having a third voltage threshold less than both the first voltage threshold and the second voltage threshold.

7. The system of claim 6,
    wherein calculating the predicted delay of each of the one or more critical paths includes calculating the predicted delay of each of the one or more critical paths according to the equation:

$$D_{cp} = \left(\left[D_{HVTC}^{cc} \times \left\{\frac{D_{HVTRO}}{D_{HVTRO^{cc}}}\right\}\right] + \left[D_{SVTC}^{cc} \times \left\{\frac{D_{SVTRO}}{D_{SVTRO^{cc}}}\right\}\right] + \left[D_{UVTC}^{cc} \times \left\{\frac{D_{UVTRO}}{D_{UVTRO^{cc}}}\right\}\right] + D_W\right),$$

wherein $D_{cp}$ is the predicted delay of the respective critical path, $D_{HVTC}^{cc}$ is the delay of HVT components of the respective critical path at a corner condition, $D_{HVTRO}$ is the determined delay of the HVT ring oscillators, $D_{HVTRO}^{cc}$ is the delay of the HVT ring oscillators at a corner condition, $D_{SVTC}^{cc}$ is the delay of SVT components of the respective critical path at a corner condition, $D_{SVTRO}$ is the determined delay of the SVT ring oscillators, $D_{SVTRO}{}^{cc}$ is the delay of the SVT ring oscillators at a corner condition, $D_{UVTC}{}^{cc}$ is the delay of UVT components of the respective critical path at a corner condition, $D_{UVTRO}$ is the determined delay of the UVT ring oscillators, $D_{UVTRO}{}^{cc}$ is the delay of the UVT ring oscillators at a corner condition, and $D_W$ is the wire delay of the respective critical path.

8. The system of claim 6, wherein the method further comprises:
adding to the predicted delay of each of the one or more critical paths at least one of the following: a timing margin or a technology margin.

9. The system of claim 6, wherein the one or more critical paths includes a plurality of critical paths and the method further comprises determining a longest predicted critical path delay from among the plurality of predicted delays calculated for the plurality of critical paths.

10. The system of claim 9, wherein the method further comprises:
calculating a critical path slack according to the equation:

$$S_{cp} = \left(\frac{1}{F_{sys}}\right) - \text{longest } D_{cp},$$

wherein $S_{cp}$ is the critical path slack, $F_{sys}$ is a system frequency, and longest $D_{cp}$ is the longest predicted critical path delay.

11. A system for providing a critical path delay estimate to an adaptive voltage scaling (AVS) system, wherein the AVS system reduces a power consumption of an integrated circuit, the system comprising:
at least one computing device configured to provide a critical path delay estimate for the integrated circuit by performing a method comprising:
determining a respective delay of each of a plurality of on-board ring oscillators on the integrated circuit based on a real-time measurement of a respective frequency of each of the plurality of ring oscillators, wherein the plurality of on-board ring oscillators includes one or more on-board high-voltage threshold (HVT) ring oscillators, one or more on-board medium-voltage threshold (SVT) ring oscillators, and one or more on-board low-voltage threshold (UVT) ring oscillators; and
calculating a predicted delay for each of the one or more critical paths based on a delay of components of the respective critical path at a corner condition, a wire delay of the respective critical path, a delay of each of the plurality of on-board ring oscillators at a corner condition, and the determined delay of each of the plurality of on-board ring oscillators,
wherein each of the one or more critical paths include at least one HVT component on the integrated circuit having a first voltage threshold, at least one SVT component on the integrated circuit having a second voltage threshold less than the first voltage threshold, and at least one UVT component on the integrated circuit having a third voltage threshold less than both the first voltage threshold and the second voltage threshold;
determining the critical path delay estimate based on the predicted delay for each of the one or more critical paths; and
providing the critical path delay estimate to the AVS system.

12. The system of claim 11,
wherein calculating the predicted delay of each of the one or more critical paths includes calculating the predicted delay of each of the one or more critical paths according to the equation:

$$D_{cp} = \left(\left[D_{HVTC}{}^{cc} \times \left\{\frac{D_{HVTRO}}{D_{HVTRO^{cc}}}\right\}\right] + \left[D_{SVTC}{}^{cc} \times \left\{\frac{D_{SVTRO}}{D_{SVTRO^{cc}}}\right\}\right] + \left[D_{UVTC}{}^{cc} \times \left\{\frac{D_{UVTRO}}{D_{UVTRO^{cc}}}\right\}\right] + D_W\right),$$

wherein $D_{cp}$ is the predicted delay of the respective critical path, $D_{HVTC}{}^{cc}$ is the delay of HVT components of the respective critical path at a corner condition, $D_{HVTRO}$ is the determined delay of the HVT ring oscillators, $D_{HVTRO}{}^{cc}$ is the delay of the HVT ring oscillators at a corner condition, $D_{SVTC}{}^{cc}$ is the delay of SVT components of the respective critical path at a corner condition, $D_{SVTRO}$ is the determined delay of the SVT ring oscillators, $D_{SVTRO}{}^{cc}$ is the delay of the SVT ring oscillators at a corner condition, $D_{UVTC}{}^{cc}$ is the delay of UVT components of the respective critical path at a corner condition, $D_{UVTRO}$ is the determined delay of the UVT ring oscillators, $D_{UVTRO}{}^{cc}$ is the delay of the UVT ring oscillators at a corner condition, and $D_W$ is the wire delay of the respective critical path.

13. The system of claim 11, wherein the one or more critical paths includes a plurality of critical paths and the method further comprises determining a longest predicted critical path delay from among the plurality of predicted delays calculated for the plurality of critical paths.

14. The system of claim 13, wherein the method further comprises:
calculating a critical path slack according to the equation:

$$S_{cp} = \left(\frac{1}{F_{sys}}\right) - \text{longest } D_{cp},$$

wherein $S_{cp}$ is the critical path slack, $F_{sys}$ is a system frequency, and longest $D_{cp}$ is the longest predicted critical path delay.

15. The system of claim 11, wherein the method further comprises: adding a timing margin to the predicted delay of each of the one or more critical paths.

16. The system of claim 11, wherein the method further comprises: adding a technology margin to the predicted delay of each of the one or more critical paths.

17. The system of claim 11, wherein the method further comprises: adding a timing margin and a technology margin to the predicted delay of each of the one or more critical paths.

* * * * *